United States Patent
Moriwaki et al.

(10) Patent No.: US 6,574,116 B2
(45) Date of Patent: Jun. 3, 2003

(54) INVERTER CAPACITOR MODULE AND INVERTER

(75) Inventors: Nobushige Moriwaki, Izumo (JP); Shigeki Nishiyama, Izumo (JP); Kazuhiro Yoshida, Okayama-ken (JP); Masahiro Nishio, Izumo (JP); Kazuyuki Kubota, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/866,424

(22) Filed: May 25, 2001

(65) Prior Publication Data

US 2001/0055194 A1 Dec. 27, 2001

(30) Foreign Application Priority Data

Jun. 7, 2000 (JP) ........................................ 2000-170894

(51) Int. Cl.⁷ ............................. H05K 7/02; H05K 7/06; H05K 7/08; H05K 7/10
(52) U.S. Cl. ........................ 361/782; 361/784; 361/790; 174/262
(58) Field of Search ................................. 361/742, 790, 361/782, 784, 772–774; 174/255–262; 252/685, 686, 723, 724

(56) References Cited

U.S. PATENT DOCUMENTS 5,241,454 A * 8/1993 Ameen et al. .............. 174/255
5,481,134 A * 1/1996 Sobhani et al. ............. 257/685
6,185,105 B1 * 2/2001 Inoguchi ..................... 174/260
6,297,960 B1 * 10/2001 Moden et al. .............. 257/724

FOREIGN PATENT DOCUMENTS

JP          9-308265        11/1997

\* cited by examiner

Primary Examiner—David L. Talbott
Assistant Examiner—Tuan Dinh
(74) Attorney, Agent, or Firm—Keating & Bennett, LLP (57) ABSTRACT

An inverter capacitor module includes a plurality of substrates having a plurality of ceramic capacitors provided on the top surfaces thereof, and first and second feeding unit lands having conductive films provided on both surfaces thereof and arranged to feed the plurality of ceramic capacitors, the first and second feeding unit lands on both surfaces thereof being electrically connected to each other, a conductive spacer inserted between the plurality of substrates for establishing one of an electrical connection between the first feeding unit lands of an underlying substrate and its overlying substrate and an electrical connection between the second feeding unit lands of an underlying substrate and its overlying substrate, a fixing member arranged to fix the plurality of substrates laminated via the conductive spacer, and a switching module fixed below the bottom substrate among the plurality of substrates that are laminated. In the inverter capacitance module, the switching module is fixed to the plurality of substrates by the fixing element.

20 Claims, 6 Drawing Sheets

INVERTER CAPACITOR MODULE AND INVERTER

BACKGROUND OF THE INVENTION

1. Field of the Invention

The present invention relates to inverter capacitor modules and inverters, and more particularly, the present invention relates to an inverter capacitor module and an inverter for use, for example, in a power module or other suitable apparatus.

2. Description of the Related Art

Figure 6:
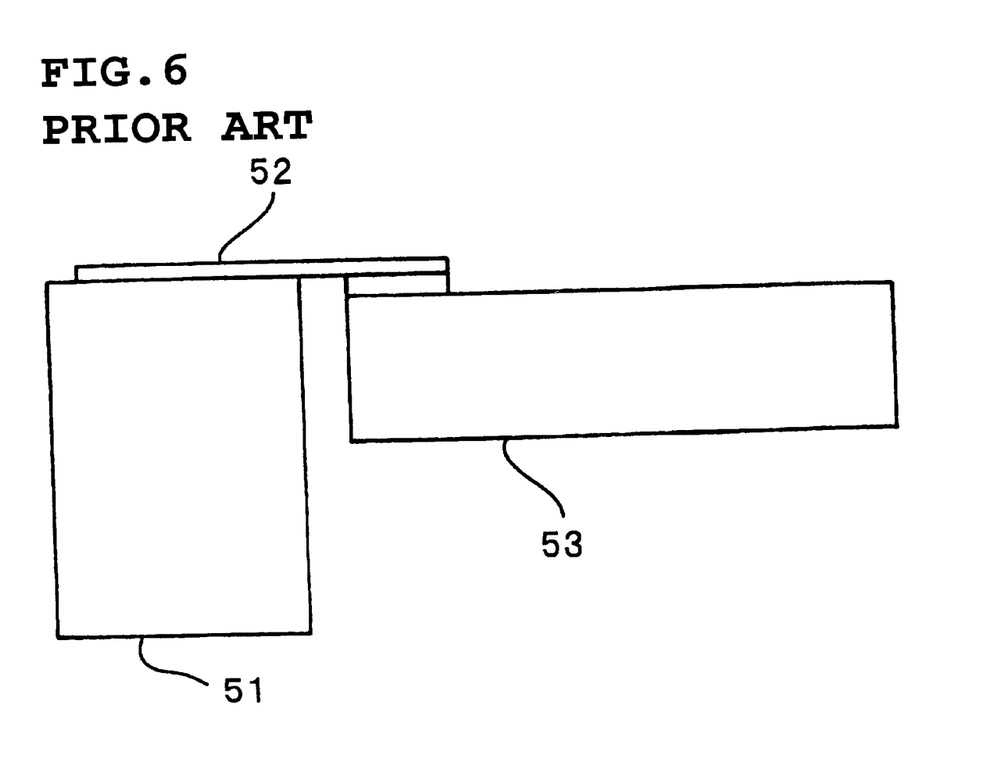
FIG. 6 is a front view illustrating a conventional inverter.

Inverters are provided with switching elements and capacitors. As shown in FIG. 6, a terminal 52 of a capacitor 51 is electrically connected to a switching element 53. Although only the terminal 52 is shown in FIG. 6, other terminals of the capacitor 51 having different polarities are each electrically connected to the switching element 53. In an actual inverter, the capacitor 51 and the switching element 53 are mounted on an insulating housing (not shown).

As has been demanded for other electrical devices and electrical components, miniaturization has been demanded for inverters as well. In Japanese Unexamined Patent Publication No. 9-308265, there is disclosed an inverter device for an electric vehicle for achieving an effective utilization of installation space by decreasing the installation area.

In this inverter device, a smoothing capacitor including an electrolytic capacitor is provided above a switching module by bending an input conductive plate connected to an input terminal unit of the switching module and then by connecting the smoothing capacitor to the bent input conductive plate. Since the smoothing capacitor having the relatively bulky electrolytic capacitor is disposed above the switching module, reduction in the installation area can be achieved.

Since, as described above, the conventional inverter makes use of the bulky electrolytic capacitor, an electrical connection member located between the capacitor and the switching module, such as the input conductive plate, requires a certain length. Hence, an inductance component occurs in this electrical connection member.

In order to decrease the inductance component, the capacitor should be located nearer to the switching module. Therefore, the capacitor has been arranged so as to be as close to the switching module as possible.

However, the electrolytic capacitor is bulky, requiring a certain length for the electrical connection member between the electrolytic capacitor and the switching module. Therefore, as long as the electrical connection member has a certain length, there are limits to minimizing the inductance component.

Furthermore, since the conventional inverter is provided with the bulky electrolytic capacitor, the size of the inverter cannot be reduced. In addition, since sufficient heat dissipation cannot be provided, resin must be filled in a casing in order to increase the amount of heat dissipation.

To solve these problems, a flat-type capacitor module obtained by mounting a plurality of ceramic capacitors having first and second terminals in a substrate and the inverter provided with this capacitor module are proposed in Japanese Unexamined Patent Application No. 11-361548 (not published). However, when the capacitance is insufficient, the substrate size of the capacitor module must be increased in order to increase the number of mounted ceramic capacitors. Accordingly, when the switching module is mounted below the capacitor module, the downwardly projected area of the capacitor module is larger than the area of the switching module. This makes it difficult to miniaturize the inverter.

SUMMARY OF THE INVENTION

In order to overcome the problems described above, preferred embodiments of the present invention provide an inverter capacitor module and an inverter that is miniaturized, has excellent dissipation characteristics and that minimizes an inductance component generated in an electrical connection member located between a capacitor module.

In addition, preferred embodiments of the present invention provide an inverter capacitor module and an inverter that are miniaturized even when a larger capacitance is provided therein.

According to a first preferred embodiment of the present invention, an inverter capacitor module includes a plurality of substrates having a plurality of ceramic capacitors provided on the top surfaces thereof, and first and second feeding unit lands having conductive films disposed on both surfaces thereof for feeding the plurality of ceramic capacitors, the first and second feeding unit lands on both surfaces thereof being electrically connected to each other, a conductive spacer inserted between the plurality of substrates for establishing one of an electrical connection between the first feeding unit lands of an underlying substrate and its overlying substrate and an electrical connection between the second feeding unit lands of an underlying substrate and its overlying substrate, a fixing device arranged to fix the plurality of substrates laminated via the conductive spacer, and a switching module arranged so as to be fixed below the bottom substrate among the plurality of substrates that are laminated. In the inverter capacitor module, the switching module is fixed to the plurality of substrates by the fixing device.

In the inverter capacitance module, the fixing device fixes a plurality of substrates provided with a plurality of ceramic capacitors in a laminated arrangement via the conductive spacers, so that the conductive spacers establish electrical connections between the substrates. Therefore, the capacitance can be easily adjusted by increasing the number of substrates instead of increasing the downwardly projected area of the capacitor module. Since the switching module is fixedly mounted on the bottom surface of the bottom layer substrate, when the inverter is constructed using the capacitor module and the switching module in the above-described fixed manner, the area required to install the inverter is greatly decreased.

Alternatively, in the inverter capacitor module, a plurality of ceramic capacitors each includes first and second terminals. The first terminal is electrically connected to the first feeding unit land and the second terminal is electrically connected to the second feeding unit land.

Since each of the ceramic capacitors which includes the first and second terminals have the first and second terminals electrically connected to the first and second feeding unit lands, respectively, each substrate can be connected to a plurality of laminated capacitors in parallel.

Alternatively, in the inverter capacitor module, a plurality of substrates each includes a printed-circuit board and first and second through-hole electrodes arranged to establish electrical connections between the first feeding unit lands on both surfaces of each of the plurality of substrates and between the second feeding unit lands on both surfaces of each of the plurality of substrates, respectively.

When the through-hole electrodes each establish the electrical connections between the first feeding unit lands and between the second feeding unit lands provided on both surfaces of each of the substrates including the printed-circuit boards, the circuit provided in each of the substrates can be connected in parallel via the conductive spacers.

Alternatively, in the inverter capacitor module, a projecting unit upwardly projecting from the top surface or downwardly projecting from the bottom surface of the conductive spacer and including a male screw disposed on the outer periphery of the projecting unit is provided, a hole including a female thread capable of being engaged with the male screw in the inner periphery of the hole is provided in the bottom surface or the top surface of the conductive spacer, and a plurality of conductive spacers is fastened using the male screw and the female screw provided in the hole.

When the projecting unit having the male screw disposed on the outer periphery thereof is provided on the top surface or the bottom surface of the conductive spacer and the screw hole having the female thread disposed on the internal periphery thereof is provided on the bottom surface or the top surface of the conductive space, a plurality of conductive spacers can be fastened using the male screws and the screw holes of the conductive spacers. That is, since the male screw and the screw hole constitute the fixing device, another fixing member such as a bolt is not required. In addition, since the fastening force is independently applied to each substrate, the contact resistance between the substrate and the conductive spacer can be decreased and can be stabilized. In addition, since the electrical connection can be achieved via the contact device between the male screw and the screw hole, the current amount is increased and the heat is eliminated.

According to another preferred embodiment of the present invention, an inverter includes the inverter capacitor module according to the above-described preferred embodiment of the present invention and a switching module mounted on the bottom surface of the bottom layer substrate of the capacitor module.

Since the inverter includes the above-described inverter capacitor module and the switching module mounted below the bottom layer substrate of the capacitor module, a miniaturized inverter that easily varies the capacitance is easily provided.

Other features, elements, characteristics and advantages of the present invention will become more apparent from the following detailed description of preferred embodiments of the present invention with reference to the attached figures.

DETAILED DESCRIPTION OF PREFERRED EMBODIMENTS

Figure 2A:
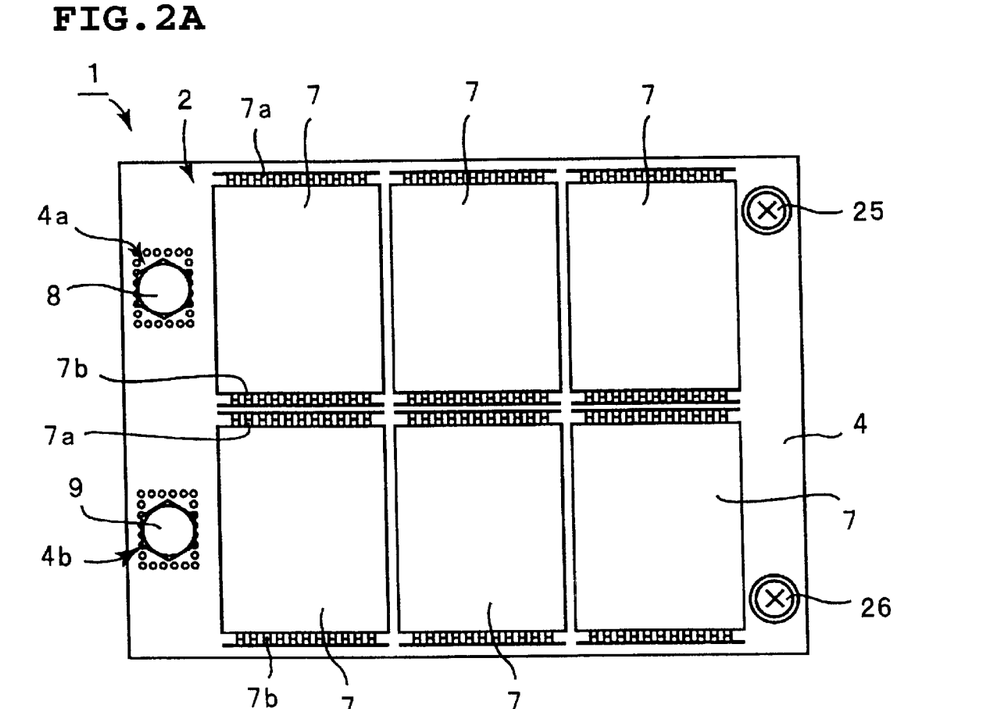
FIGS. 2A and 2B are a plan view and cross-sectional partially cutaway front view illustrating an inverter according to the preferred embodiment of FIG. 1.
Figure 2B:
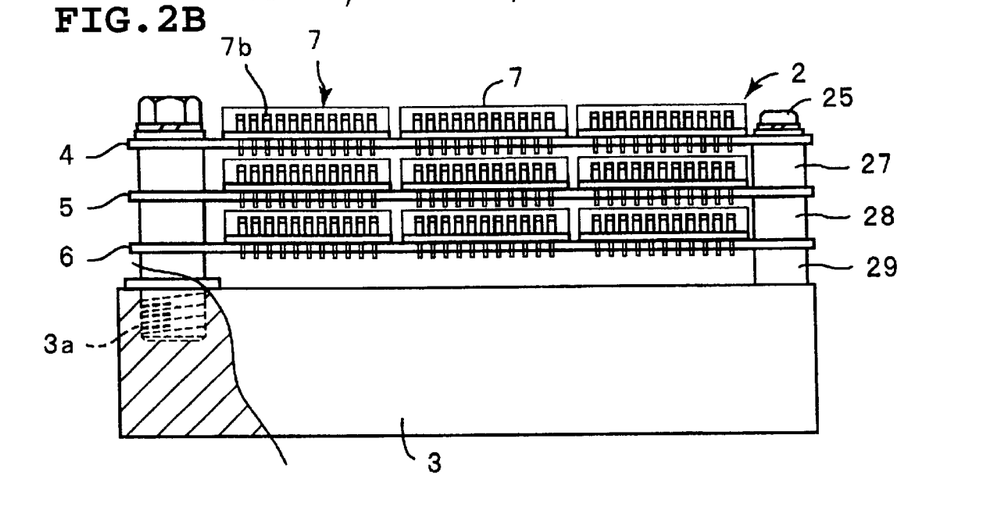

FIGS. 2A and 2B are a plan view and partially cutaway front view illustrating an inverter according to a preferred embodiment of the present invention.

An inverter 1 includes an inverter capacitor module 2 and a switching module 3. The capacitor module 2 includes a plurality of laminated capacitors 7 mounted as ceramic capacitors on each of a plurality of substrates 4 to 6. The laminated capacitor 7 includes first and second lead terminals 7a and 7b having different polarities. The first and second lead terminals 7a and 7b each include a plurality of metal-tongue pieces formed by cutting and raising metal plates.

As is shown in FIG. 2A, the substrate 4 is provided with first and second terminal mounting units 4a and 4b. The terminal mounting units 4a and 4b include through holes disposed in the substrate 4. Likewise, the first and second terminal mounting units include through holes disposed in the substrates 5 and 6. Bolts 8 and 9 are inserted through these through holes in order to fix the substrates 4 to 6 to the switching module 3.

Figure 3:
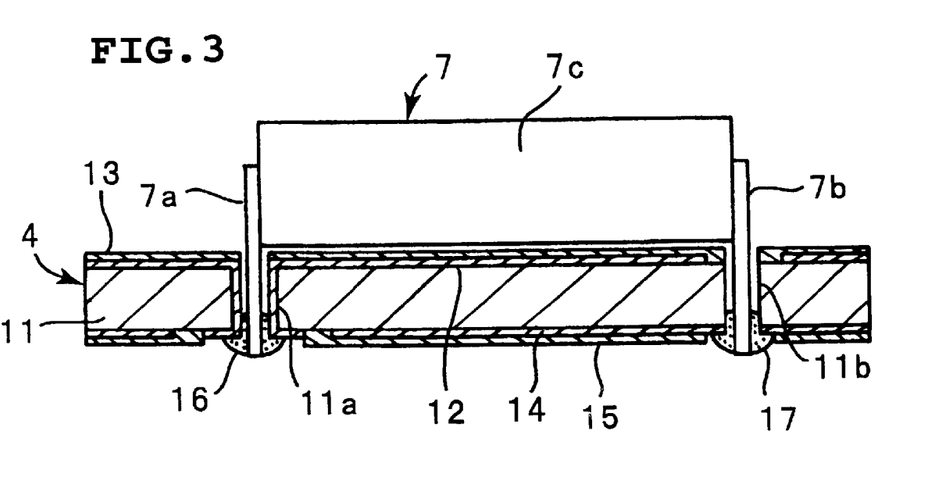
FIG. 3 is a cross-sectional view obtained by enlarging an element mounted on one ceramic capacitor substrate according to the preferred embodiment shown in FIG. 1.

A construction in which the laminated capacitor 7 is mounted on the substrate 4 is described with reference to FIGS. 3 and 4. FIG. 3 is a cross-sectional view obtained by enlarging a portion in which the laminated capacitor 7 is mounted on the substrate 4.

As shown in FIG. 3, the substrate 4 preferably includes an insulating substrate main body 11 having an insulating material such as a glass epoxy. The insulating substrate main body 11 may be constructed using another insulating material, such as a synthetic resin (e.g. phenol) or ceramic or other suitable material. The substrates 5 and 6 are preferably constructed in the same manner as the substrate 4.

Through holes 11a and 11b for inserting the metal-tongue pieces of the first and second lead terminals 7a and 7b of the laminated capacitor 7 therethrough are formed in the insulating substrate main body 11.

The laminated capacitor 7 is constructed as a component with the leads having the first and second lead terminals 7a and 7b joined to both corresponding end surfaces of a capacitor element body 7c.

Figure 4A:
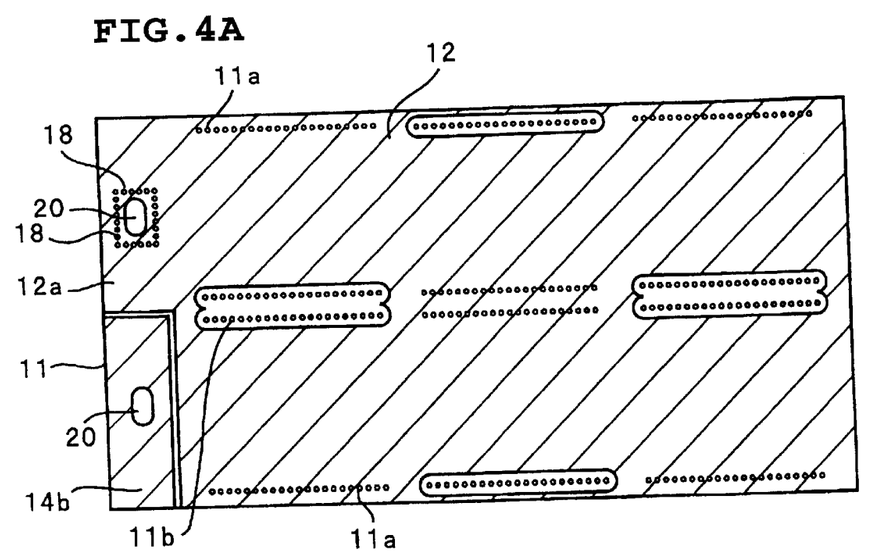
FIGS. 4A and 4B are a plan view and bottom view of a substrate used in the preferred embodiment of FIG. 1.

As shown in FIG. 4A, a first conductor 12 is provided on the top surface of the insulating substrate main body 11, i.e. substantially the entire top surface of the substrate 4. Although the first conductor 12 includes Cu in the present preferred embodiment, it may be constructed using another conductive material such as Ag or Al or other suitable material. A portion of the first conductor 12 extending up to the periphery of a through hole 20 constitutes a first feeding unit 12a and a first feeding unit 12b is provided on the bottom surface of the substrate 4 so as to face the first feeding unit 12a. A plurality of through-hole electrodes 18 which are provided in the substrate 4 establishes electrical connections between the first feeding units 12a and 12b on both surfaces of the substrate 4.

As shown in FIG. 3, in the portion in which the capacitor 7 is mounted, the first conductor 12 is provided on the bottom surface of the insulating substrate main body 11 so as to be led via the inner periphery surface of the through hole 11a up to the periphery of the through hole 11a. The first conductor 12 is disposed on the top surface except around the periphery of the through hole 11b. The first conductor 12 is arranged so as not to be led up to the through hole 11b.

An insulating coating 13 is disposed on the top surface of the first conductor 12. The insulating coating 13 is disposed on the top surface of the insulating substrate main body 11 so as to be led up to the periphery of the through hole 11b. This prevents an occurrence of a short circuit between the lead terminal 7b and the first conductor 12. The insulating coating 13 can be formed using an appropriate synthetic resin coating or other suitable material.

Figure 4B:
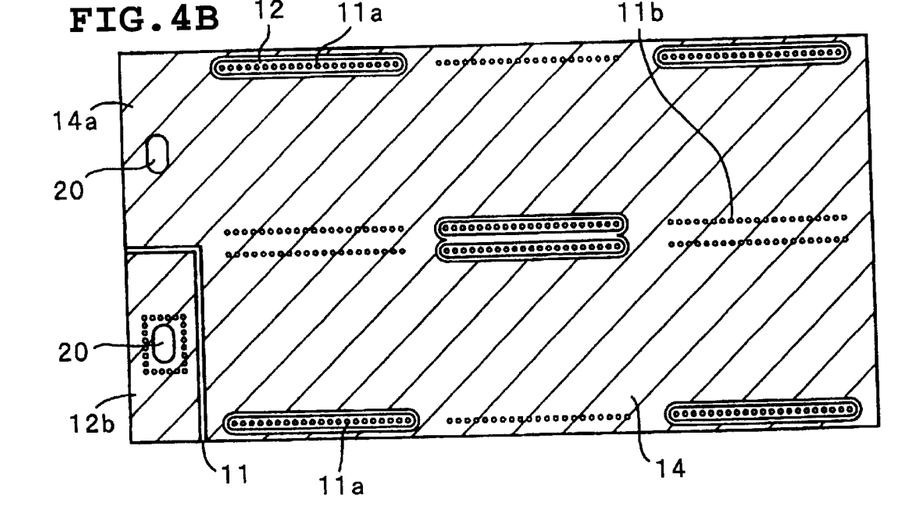

As shown in FIG. 4B, a second conductor 14 is disposed on substantially the entire bottom surface of the insulating substrate main body 11. Apart from the periphery of the through hole 11a, the second conductor 14 is arranged so as to be isolated from the first feeding unit 12b. The periphery of the through hole 20 of the second conductor 14 constitutes the second feeding unit 14a. A feeding unit 14b is disposed on the top surface of the substrate 4. Through-hole electrodes establish electrical connections between the second feeding units 14a and 14b. The second conductor 14 is arranged so as to maintain a predetermined distance from a portion in which the first conductor 12 reaches the periphery of the through hole 11a at the bottom surface of the substrate 4. The second conductor 14 is constructed preferably using the same materials as those of the first conductor 12. Alternatively, the second conductor 14 may be constructed using another conductive material.

An insulating coating 15 is arranged so as to have the second conductor 14 coated (see FIG. 3). The insulating coating 15 is formed so that the second conductor 14 is exposed at the periphery of an opening of the through hole 11b.

The insulating coating 15 is arranged so that a part is exposed in which the first conductor 12 reaches the periphery of the through hole 11a at the bottom surface of the substrate 4, in other words, so that the insulating coating 15 does not extend to the first conductor 12.

The laminated capacitor 7 is mounted on the substrate 4 so that the lead terminals 7a and 7b are inserted through the through holes 11a and 11b. In this case, the lead terminal 7a is joined to the first conductor 12 via solder 16 and the lead terminal 7b is joined to the second conductor 14 via solder 17.

The laminated capacitors 7 are mounted on the substrates 5 and 6 in the same manner as in the substrate 4.

As is seen in FIG. 3, the lead terminal 7a connected to one potential of the laminated capacitor 7 is electrically connected to the first conductor 12 and the lead terminal 7b connected to the other potential is electrically connected to the second conductor 14. The first and second conductors 12 and 14 are disposed on substantially the entire top and bottom surfaces of the substrate 4, respectively.

Therefore, when the inverter is constructed by mounting the switching module 3 on the laminated capacitor module 1 according to the below-described mounting construction, an electric current flows in the first and second conductors 12 and 14. Since the first and second conductors 12 and 14 are arranged so as to occupy substantially the entire area of both surfaces of each of the substrates 4 to 6, high currents can be obtained.

Since the first and second conductors are arranged to extend across large areas, high currents flow in various directions through the first and second conductors 12 and 14, generating various shunt currents. When the currents flow from the first conductor 12 to the second conductor 14 or when the currents flow from the second conductor 14 to the first conductor 12, occurrence of the inductance component is prevented in the electrical connection member constituted by the first and second conductors 12 and 14.

Particularly, when the currents flow from the first terminal mounting unit 4a to the second terminal mounting unit 4b via the first conductor 12, the laminated capacitor 7, and the second conductor 14 in which the first and second terminal mounting units 4a and 4b are provided in close proximity to each other, since the flow directions of the currents generated on the top surface and the bottom surface of the substrate 4 are opposite, the inductance components occurring due to the generated currents are effectively cancelled.

In addition, use of the laminated capacitor 7 that is much smaller than the electrolytic capacitor enables more laminated capacitors 7 to be mounted on the substrates 4 to 6. Since the switching module 3 is directly mounted below the bottom layer of the substrate 6, miniaturization of the inverter can be achieved. In addition, since miniaturization decreases the length of the electrical connection member, this also prevents the occurrence of the unwanted inductance component.

A detailed construction for fixing the substrates 4 to 6 to the switching module 3 is described with reference to FIGS. 1 and 2.

Figure 1:
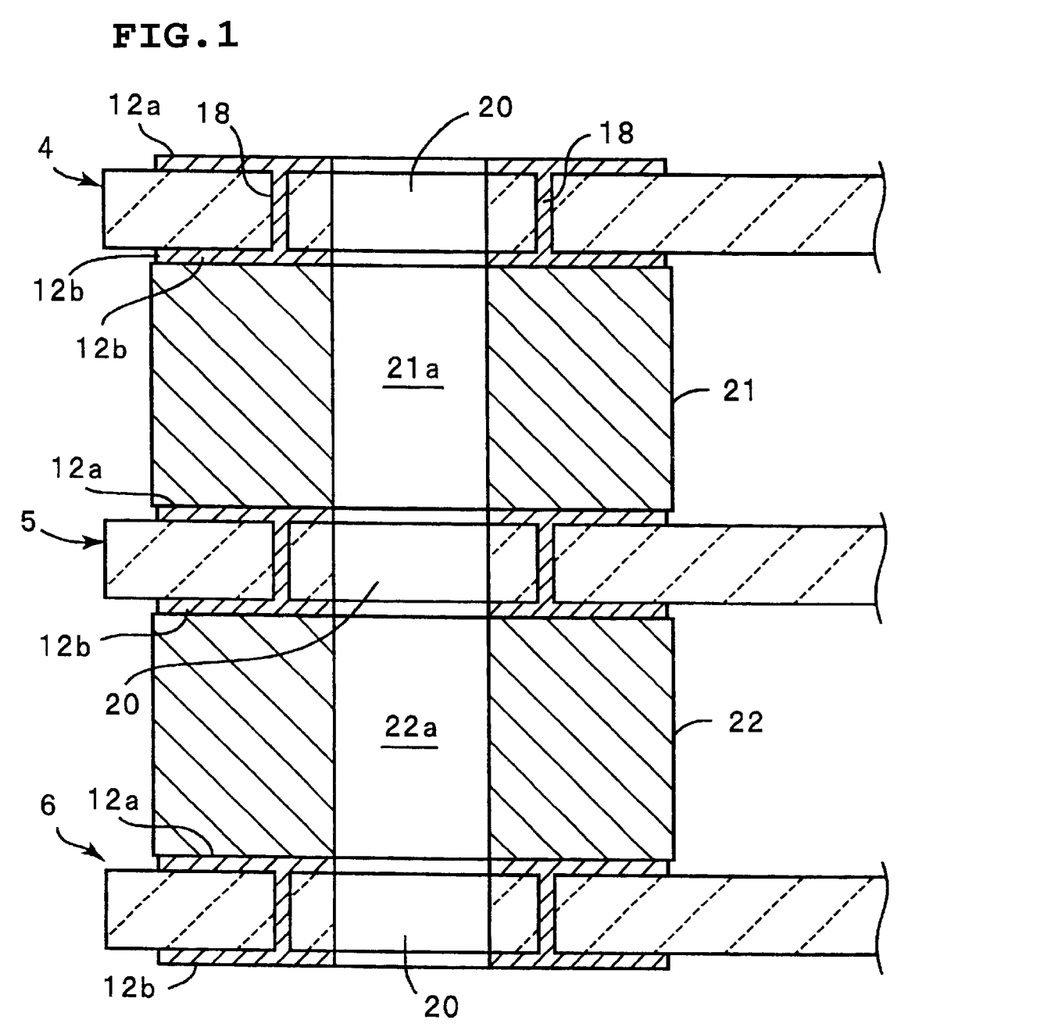
FIG. 1 is a cross-sectional view illustrating an important portion of an inverter capacitor module according to a preferred embodiment of the present invention.

FIG. 1 is a cross-sectional view schematically illustrating the construction of the proximity of the terminal mounting elements of the substrates 4 to 6. In FIG. 1, the bolts 8 and 9 shown in FIG. 2B are not shown.

That is, although FIG. 1 shows the front cross-sectional view of a portion in which the bolt 8 is to be installed, instead of the bolt 8, the through hole 20 constituting the terminal mounting element 4a is shown in FIG. 1.

In the present preferred embodiment, conductive spacers 21 and 22 are provided among the substrates 4 to 6. Although the conductive spacers 21 and 22 are preferably made of metal, they may be obtained by coating the surface of the insulating material with the conductive material.

The conductive spacers 21 and 22 include the through holes 21a and 22a, respectively. The through holes 21a and 22a are preferably constructed in the same manner as the through hole 20 so that the bolt 8 is inserted therethrough. Preferably, the diameters of the through holes 21a and 22a are substantially equal to that of the through hole 20a.

As shown in FIG. 2B, a screw hole 3a is formed in the top surface of the switching module 3. The screw hole 3a is constructed so that the bolt 8 is screwed into the screw hole 3a. Accordingly, in the inverter 1 of the present preferred embodiment, the substrates 4 to 6 are fastened to the switching module 3 by mounting the bolt 8 so as to be inserted through the through holes 20 and through holes 21a and 22a of the conductive spacers 21 and 22, and then by screwing the top of the bolt 8 into the screw hole 3a of the switching module 3. A fastening element including the bolt 9 is preferably constructed in the same manner as the fastening element including the bolt 8.

The conductive spacer 21 establishes an electrical connection between the first feeding unit 12b on the bottom surface of the substrate 4 and the first feeding unit 12a on the top surface of the substrate 5. Furthermore, the conductive spacer 22 establishes an electrical connection between the first feeding unit 12b on the bottom surface of the substrate 5 and the first feeding unit 12a of the top surface of the substrate 6. That is, the fastening element including the bolt 8 electrically connects the first feeding units of the substrates 4 to 6. The fastening element on the bolt 9 side also allows the second feeding units of the substrates 4 to 6 to be electrically connected. Therefore, the mounting constructions using the conductive spacers 21 and 22 and the bolts 8 and 9 can allow circuits including the substrates 4 to 6 to be electrically connected in parallel.

In the substrates 5 and 6, through-hole electrodes allow the first feeding units on both surfaces thereof to be electrically connected as well as the second feeding units on both surfaces thereof to be electrically connected.

As shown in FIG. 2, fixing bolts 25 and 26 are provided in the proximity of the end that is opposite to the side provided with the bolts 8 and 9. The fixing bolts 25 and 26 are used simply for fixing the substrates 4 to 6 to the switching module 3. Therefore, insulating spacers 27 to 29 are disposed between the substrates 4 to 6.

Although the bolts 25 and 26 may not be provided, since use of the bolts 25 and 26 and the insulating spacers 27 to 29 can allow the substrates 4 to 6 to be fixed in the same fashion as in the side provided with the bolts 9 and 10, it is preferable that the substrates 4 to 6 be more firmly fixed to the switching module 3.

Figure 5:
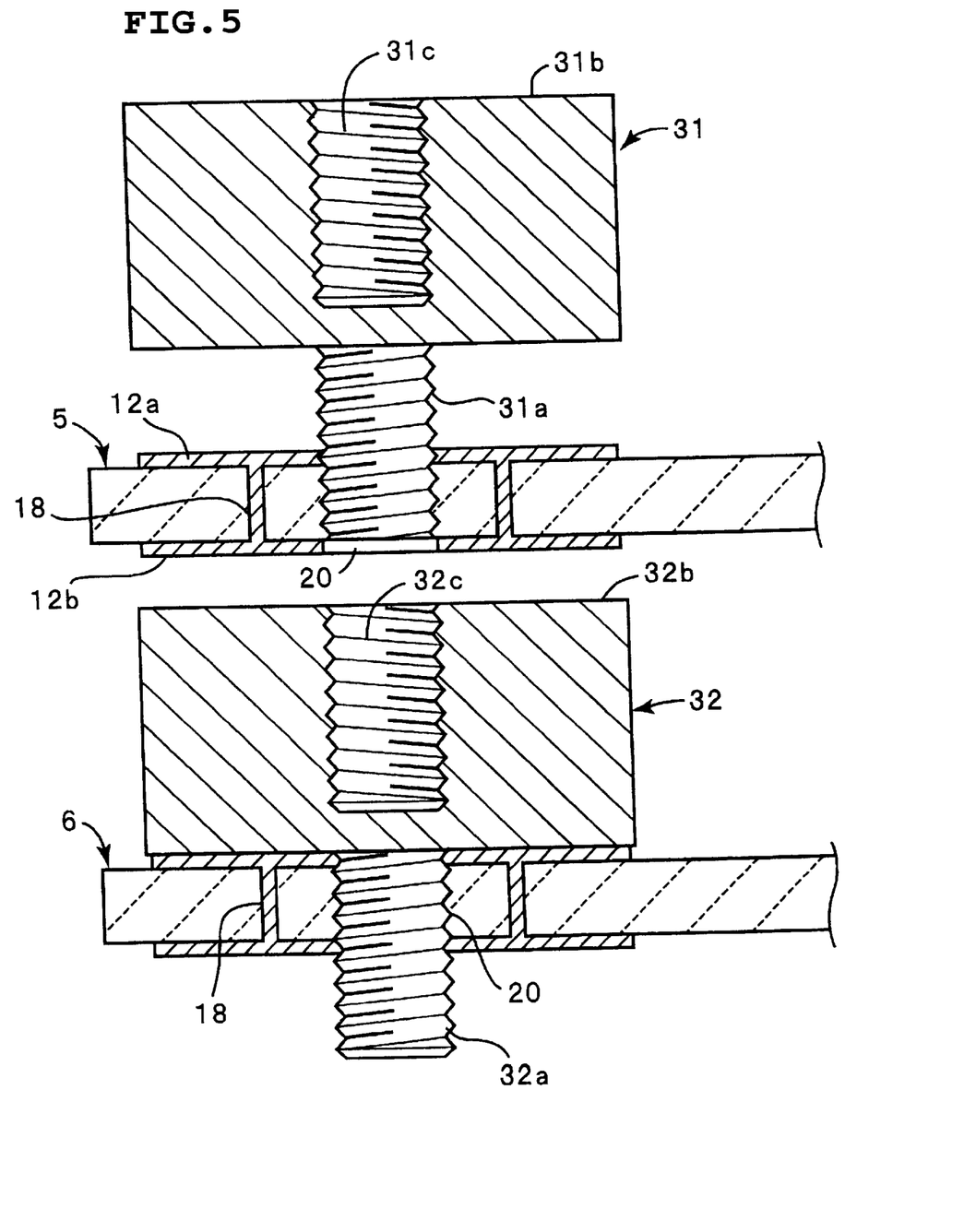
FIG. 5 is a cross-sectional partially cutaway front view illustrating a fastening construction between a conductive spacer and the substrate of a modified example of the preferred embodiment of FIG. 1.

Although use of the conductive spacers 21 and 22 provided with the through holes 21a and 22a, respectively, and use of the bolts 8 and 9 fasten the substrates 4 to 6 to the switching module 3 are described, the substrates 4 to 6 may be fixed to the switching module 3 by providing a fastening construction in the conductive spacer without use of the bolts. FIG. 5 shows such a modified example.

In FIG. 5, the substrates 5 and 6 and conductive spacers 31 and 32 which are disposed above and below the substrate 5, respectively, are shown. The conductive spacers 31 and 32 include projecting units 31a and 32a, respectively, which are projected downwardly from the bottom surfaces thereof. Male screws are provided on the outer peripheries of the projecting units 31a and 32a.

Screw holes 31c and 32c having female threads formed in the inner peripheries thereof are provided in top surfaces 31b and 32b of the conductive spacers 31 and 32, respectively. The female threads formed in the inner peripheries of the screw holes 31c and 32c are constructed so as to be engaged with the male screws provided on the projecting units 31a and 32a.

As shown in FIG. 5, when the conductive spacer 32 is provided between the substrates 5 and 6, the conductive spacer 32 causes the substrates 5 and 6 to be fastened by further inserting the projecting unit 31a of the conductive spacer 31 into the through hole 20 and by screwing the projecting unit 31a into the screw hole 32c of the conductive spacer 32. This construction for fastening the conductive spacers 31 and 32 to each other eliminates the need for the bolts.

In this case, preferably, the projection lengths of the projecting units 31a and 32a are shorter than the depths of the screw holes 31c and 32c.

In the modified example shown in FIG. 5, since fastening forces are independently applied to a pair of substrates, a plurality of substrates can be more firmly fastened.

Since the electrical connections can be obtained by causing not only the top surfaces 31b and 32b and the bottom surfaces of the conductive spacers 31 and 32 but also the projecting units 31a and 32a and the screw holes 31c and 32c to be contacted, the reliability of the electrical connections is greatly increased.

While the present invention has been described with reference to what is presently considered to be the preferred embodiment, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An inverter capacitor module comprising:
    a plurality of substrates including:
        a plurality of ceramic capacitors provided on top surfaces of each the plurality of substrates; and
        first and second feeding unit lands having conductive films, said first and second feeding unit lands being arranged on both surfaces of each of said plurality of substrates so as to feed said plurality of ceramic capacitors, the first and second feeding unit lands being electrically connected to each other;
    a conductive spacer inserted between said plurality of substrates for establishing one of an electrical connection between the first feeding unit lands of an underlying one of the substrates and an overlying one of the substrates, and an electrical connection between the second feeding unit lands of an underlying one of the substrates and an overlying one of the substrates;
    a fixing element arranged to fix said plurality of substrates in a laminated arrangement via said conductive spacer; and
    a switching module that is fixed below the bottom substrate among said plurality of substrates that are laminated;
    wherein said switching module is fixed to said plurality of substrates by said fixing element.

2. An inverter capacitor module according to claim 1, wherein said plurality of ceramic capacitors each includes first and second terminals and the first terminal is electrically connected to the first feeding unit land and the second terminal is electrically connected to the second feeding unit land.

3. An inverter capacitor module according to claim 1, further comprising:
    a projecting unit arranged to upwardly project from the top surface or downwardly project from the bottom surface of said conductive spacer and including a male screw disposed on the outer periphery thereof;
    a hole including a female thread capable of being engaged with said male screw in the inner periphery thereof and provided in the bottom surface or the top surface of said conductive spacer; and
    a plurality of conductive spacers are fastened via said male screw and said female thread provided in said hole.

4. An inverter capacitor module according to claim 1, wherein said plurality of ceramic capacitors each includes first and second lead terminals each having different polarities and including a plurality of metal-tongue pieces.

5. An inverter capacitor module according to claim 1, wherein an insulating coating is disposed on a surface of the conductive film of the first feeding unit.

6. An inverter capacitor module according to claim 1, wherein an insulating coating is disposed on a surface of the conductive film of the second feeding unit.

7. An inverter capacitor module according to claim 1, wherein the conductive films of the first and second feeding units are arranged to occupy substantially the entire area of both surfaces of each of the respective substrates on which the conductive films are disposed.

8. An inverter capacitor module according to claim 1, wherein the fixing element includes a plurality of bolts.

9. An inverter capacitor module according to claim 2, wherein each of said plurality of substrates includes a printed-circuit board and first and second through-hole electrodes arranged to establish electrical connections between the first feeding unit lands arranged on both surfaces of each of said plurality of substances and between the second feeding unit lands arranged on both surfaces of each of said plurality of substrates, respectively.

10. An inverter capacitor module according to claim 8, wherein the fixing element further includes a plurality of through holes formed in the plurality of substrates and arranged to receive the plurality of bolts.

11. An inverter comprising:
   an inverter capacitor module including:
      a plurality of substrates having:
         a plurality of ceramic capacitors provided on top surfaces of each of the plurality of substrates; and
         first and second feeding unit lands having conductive films, said first and second feeding unit lands being arranged on both surfaces of each of said plurality of substrates so as to feed said plurality of ceramic capacitors, the first and second feeding unit lands being electrically connected to each other;
      a conductive spacer inserted between said plurality of substrates for establishing one of an electrical connection between the first feeding unit lands of an underlying one of the substrates and an overlying one of the substrates and an electrical connection between the second feeding unit lands of an underlying one of the substrates and an overlying one of the substrates; and
      a fixing element arranged to fix said plurality of substrates in a laminated arrangement via said conductive spacer;
      wherein said switching module is fixed to said plurality of substrates by said fixing element; and
   a switching module mounted on the bottom surface side of the bottom layer substrate of said inverter capacitor module.

12. An inverter according to claim 11, wherein said plurality of ceramic capacitors each includes first and second terminals and the first terminal is electrically connected to the first feeding unit land and the second terminal is electrically connected to the second feeding unit land.

13. An inverter according to claim 11, further comprising:
   a projecting unit arranged to upwardly project from the top surface or downwardly project from the bottom surface of said conductive spacer and including a male screw disposed on the outer periphery thereof;
   a hole including a female thread capable of being engaged with said male screw in the inner periphery thereof and provided in the bottom surface or the top surface of said conductive spacer; and
   a plurality of conductive spacers are fastened via said male screw and said female thread provided in said hole.

14. An inverter according to claim 11, wherein said plurality of ceramic capacitors each includes first and second lead terminals each having different polarities and including a plurality of metal-tongue pieces.

15. An inverter according to claim 11, wherein an insulating coating is disposed on a surface of the conductive film of the first feeding unit.

16. An inverter according to claim 11, wherein an insulating coating is disposed on a surface of the conductive film of the second feeding unit.

17. An inverter according to claim 11, wherein the conductive films of the first and second feeding units are arranged to occupy substantially the entire area of both surfaces of each of the respective substrates on which the conductive films are disposed.

18. An inverter according to claim 11, wherein the fixing element includes a plurality of bolts.

19. An inverter according to claim 12, wherein each of said plurality of substrates includes a printed-circuit board and first and second through-hole electrodes arranged to establish electrical connections between the first feeding unit lands arranged on both surfaces of each of said plurality of substrates and between the second feeding unit lands arranged on both surfaces of each of said plurality of substrates, respectively.

20. An inverter according to claim 18, wherein the fixing element further includes a plurality of through holes formed in the plurality of substrates and arranged to receive the plurality of bolts.

* * * * *